United States Patent
Sujaku et al.

(10) Patent No.: US 10,166,779 B2
(45) Date of Patent: Jan. 1, 2019

(54) METHOD FOR MANUFACTURING LIQUID-DISCHARGE-HEAD SUBSTRATE

(71) Applicant: CANON KABUSHIKI KAISHA, Tokyo (JP)

(72) Inventors: Shiro Sujaku, Kawasaki (JP); Keiji Watanabe, Kawasaki (JP); Kouji Hasegawa, Kawasaki (JP); Junya Hayasaka, Funabashi (JP); Satoshi Ibe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 265 days.

(21) Appl. No.: 15/012,668

(22) Filed: Feb. 1, 2016

(65) Prior Publication Data
US 2016/0229183 A1    Aug. 11, 2016

(30) Foreign Application Priority Data

Feb. 5, 2015 (JP) .................. 2015-021652

(51) Int. Cl.
*B41J 2/16* (2006.01)
*H01L 23/00* (2006.01)
(Continued)

(52) U.S. Cl.
CPC ........... *B41J 2/1631* (2013.01); *B41J 2/1601* (2013.01); *B41J 2/162* (2013.01); *B41J 2/1623* (2013.01);
(Continued)

(58) Field of Classification Search
CPC ........ B41J 2/1601; B41J 2/162; B41J 2/1623; B41J 2/1631; G01R 1/06711;
(Continued)

(56) References Cited

U.S. PATENT DOCUMENTS

| | | | |
|---|---|---|---|
| 2002/0097060 A1* | 7/2002 | Maekawa | G01R 1/06755 324/754.03 |
| 2005/0155202 A1* | 7/2005 | Higuchi | Y10T 29/49401 29/25.35 |

(Continued)

FOREIGN PATENT DOCUMENTS

| | | | |
|---|---|---|---|
| JP | 2005-166864 A | | 6/2005 |
| JP | 2006062145 A | * | 3/2006 |

(Continued)

OTHER PUBLICATIONS

English Translation (Machine) of Japanese Patent Publication, JP 2010-221656, Dec. 2017.*

*Primary Examiner* — A. Dexter Tugbang
(74) *Attorney, Agent, or Firm* — Canon U.S.A., Inc. IP Division

(57) ABSTRACT

A method for manufacturing a liquid-discharge-head substrate includes providing a substrate having an energy-generating element and a pad, the pad having a wiring layer and a contact-probe receiving section, the contact-probe receiving section having a Vickers hardness that is higher than a Vickers hardness of the wiring layer; bringing a contact probe into contact with the contact-probe receiving section; and performing an electrical inspection by bringing the contact probe into contact with the wiring layer in the pad.

10 Claims, 3 Drawing Sheets

(51) Int. Cl.
  *G01R 1/067* (2006.01)
  *H01L 21/762* (2006.01)
  *B23H 9/00* (2006.01)

(52) U.S. Cl.
  CPC .............. *H01L 24/13* (2013.01); *B23H 9/008* (2013.01); *G01R 1/06711* (2013.01); *G01R 1/06755* (2013.01); *G01R 1/06761* (2013.01); *H01L 21/76232* (2013.01); *Y10T 29/49004* (2015.01); *Y10T 29/49147* (2015.01); *Y10T 29/49401* (2015.01)

(58) Field of Classification Search
  CPC ............ G01R 1/06755; G01R 1/06761; Y10T 29/49004; Y10T 29/49147; Y10T 29/49401; B23H 9/008; H01L 21/76232; H01L 24/13
  See application file for complete search history.

(56) References Cited

U.S. PATENT DOCUMENTS

| | | | |
|---|---|---|---|
| 2005/0258136 A1* | 11/2005 | Kawanishi | B23H 9/008 216/54 |
| 2006/0087000 A1* | 4/2006 | Okuno | H01L 21/76232 257/506 |
| 2008/0308297 A1* | 12/2008 | Jurenka | H01L 24/13 174/126.2 |

FOREIGN PATENT DOCUMENTS

| | | | |
|---|---|---|---|
| JP | 2008170177 A | * | 7/2008 |
| JP | 2010-221656 A | | 10/2010 |
| JP | 2014-178167 A | | 9/2014 |

\* cited by examiner

METHOD FOR MANUFACTURING LIQUID-DISCHARGE-HEAD SUBSTRATE

BACKGROUND OF THE INVENTION

Field of the Invention

The present invention relates to methods for manufacturing liquid-discharge-head substrates.

Description of the Related Art

Liquid discharge apparatuses, such as ink-jet printing apparatuses, have liquid discharge heads. A liquid-discharge-head substrate used in a liquid discharge head is called a chip and has an energy-generating element, such as a heating resistor or a piezoelectric transducer. The liquid is supplied with energy by the energy-generating element so as to be discharged. In such a liquid-discharge-head substrate, a flow channel and a liquid chamber are formed on a substrate composed of, for example, silicon, and the energy-generating element is disposed within the liquid chamber. The energy-generating element is connected to a wiring layer on the substrate, and an end of the wiring layer serves as a pad. The pad is connected to an external power supply of the liquid-discharge-head substrate by, for example, bonding. The energy-generating element of the liquid-discharge-head substrate is driven by being supplied with electricity from outside the liquid-discharge-head substrate via the pad.

The pad is constituted of the wiring layer, which is composed of, for example, aluminum, and a bump section composed of, for example, gold. In the manufacturing process of the liquid-discharge-head substrate, an electrical inspection of a semiconductor integrated circuit is sometimes performed on the wiring layer of the pad by using a contact probe. In the electrical inspection, the contact probe is brought into contact with the wiring layer in a manner such as to scrape the surface thereof. In this case, an insulation film, such as a natural oxidized film, and the wiring layer composed of, for example, aluminum are scraped by the contact probe, thus causing an electrical inspection mark having a protruding shape to form in the wiring layer of the pad. Although a cleaning process is subsequently performed, the electrical inspection mark having the protruding shape still remains in the pad. For example, when depositing an organic material onto the substrate, the electrical inspection mark may possibly cause the thickness of the organic layer to become uneven. Unless the electrical inspection mark is completely covered by a barrier metal layer to be formed in a subsequent step, alloying may occur between the wiring layer (e.g., aluminum) and the bump section (e.g., gold) to be laminated via the barrier metal layer, possibly deteriorating an electrode function.

Japanese Patent Laid-Open No. 2010-221656 discusses how the occurrence of an electrical inspection mark in the wiring layer of the pad is reduced by forming a plurality of steps in a region with which the contact probe comes into contact and by using the plurality of steps as a stopper layer.

In the method discussed in Japanese Patent Laid-Open No. 2010-221656, the occurrence of electrical inspection marks may sometimes be reduced. However, according to examinations conducted by the present inventors, the stopper layer may sometimes break if a large contact force is applied from the contact probe during the electrical inspection or if the stylus force applied to a first contact probe is large due to uneven lengths of a plurality of contact probes. As a result, a protruding structure (i.e., an electrical inspection mark) may form in the wiring layer.

The conditions for determining the size of an electrical inspection mark include the conditions of an inspection device. However, if the contact conditions of the contact probe that scrapes the insulation film are set so as to reduce the occurrence of electrical inspection marks, the insulation film may sometimes remain without being scraped, possibly resulting in uneven resistance values.

SUMMARY OF THE INVENTION

Therefore, the present invention provides a highly-reliable liquid discharge head in which the occurrence of electrical inspection marks is reduced in the surface of a pad.

The present invention provides a method for manufacturing a liquid-discharge-head substrate having a substrate, an energy-generating element, and a pad, the energy-generating element and the pad being provided on the substrate, the pad being electrically connected to the energy-generating element, the liquid-discharge-head substrate causing liquid to be discharged by causing the energy-generating element to supply energy to the liquid. The method includes providing the substrate having the energy-generating element and the pad, the pad having a wiring layer and a contact-probe receiving section, the contact-probe receiving section having a Vickers hardness that is higher than a Vickers hardness of the wiring layer; bringing a contact probe into contact with the contact-probe receiving section; and performing an electrical inspection by bringing the contact probe into contact with the wiring layer in the pad.

Further features of the present invention will become apparent from the following description of exemplary embodiments with reference to the attached drawings.

DESCRIPTION OF THE EMBODIMENTS

Figure 1:
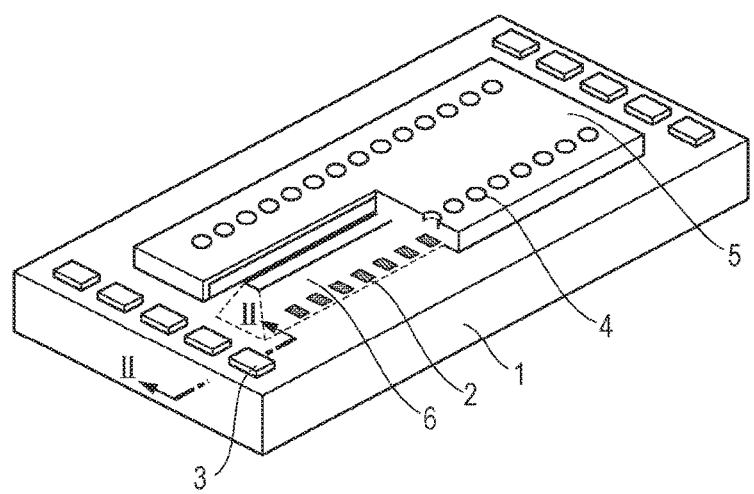
FIG. 1 is a perspective view of a liquid-discharge-head substrate.

FIG. 1 is a perspective view of a liquid-discharge-head substrate. The liquid-discharge-head substrate has a substrate 1 composed of, for example, silicon. Energy-generating elements 2 and pads 3 electrically connected to the energy-generating elements 2 by a wiring layer are provided on the substrate 1. A member 5 having a flow channel and discharge ports 4 for liquid is provided on the substrate 1. The substrate 1 is provided with a supply port 6. The liquid is supplied from the supply port 6 to the flow channel and is supplied with energy by the energy-generating elements 2 so as to be discharged from the discharge ports 4.

A method for manufacturing the liquid-discharge-head substrate shown in FIG. 1 will now be described with reference to cross-sectional views taken along line II-II in FIG. 1. Although the following description relates to a case where the energy-generating elements 2 are heating resistors, the energy-generating elements 2 may alternatively be, for example, piezoelectric transducers.

Figure 2A:
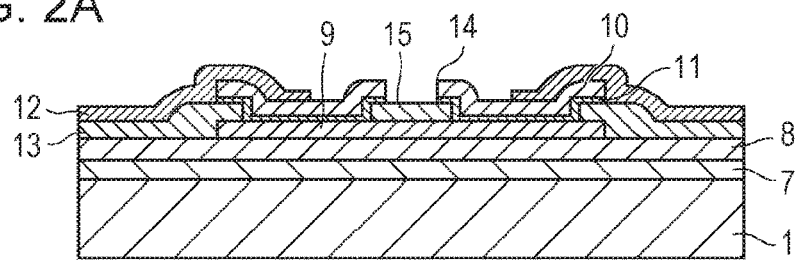
FIGS. 2A to 2D illustrate a method for manufacturing the liquid-discharge-head substrate.

First, a substrate 1 as shown in FIG. 2A is provided. A first heat accumulation layer 7 and a second heat accumulation layer 8 are formed on the substrate 1. These heat accumulation layers 7 and 8 are composed of, for example, $SiO_2$. A heating resistor layer 11 composed of, for example, TaSiN is formed above the heat accumulation layers 7 and 8. A first wiring layer 9 and a second wiring layer 10 are formed with the heating resistor layer 11 sandwiched therebetween. The first wiring layer 9 is composed of, for example, an aluminum-silicon alloy. The second wiring layer 10 is composed of, for example, an aluminum-copper alloy. A pad has the first wiring layer 9, the heating resistor layer 11, and the second wiring layer 10. A protection film 12 composed of, for example, SiN and an insulation film 13 are formed at opposite ends of the pad.

In a cross-sectional view shown in FIG. 2A, the present invention has a contact-probe receiving section 15 in a region where the second wiring layer 10 and the heating resistor layer 11 form a gap in the pad. The receiving section 15 is not covered by the second wiring layer 10 and is exposed through an opening 14 in the surface of the liquid-discharge-head substrate.

Figure 2B:
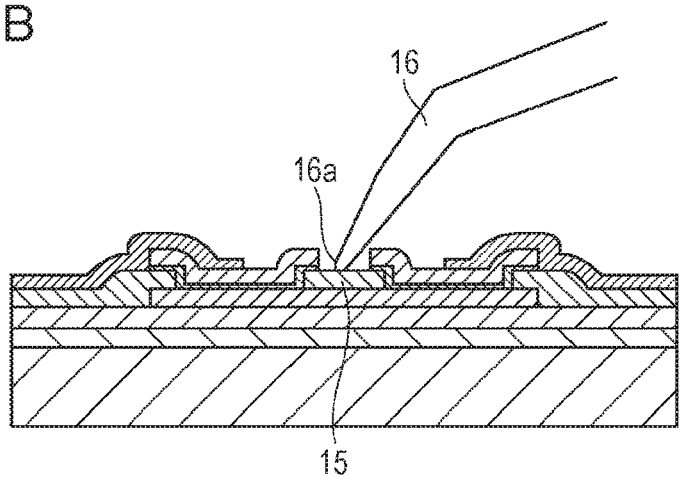

Subsequently, as shown in FIG. 2B, a contact probe 16 is brought into contact with the contact-probe receiving section 15. First, a tip 16a of the contact probe 16 is brought into contact with the contact-probe receiving section 15. Then, while further pressing the contact probe 16 against the contact-probe receiving section 15 and sliding the tip 16a on the receiving section 15 along the receiving section 15, the contact probe 16 is bent.

Figure 2C:
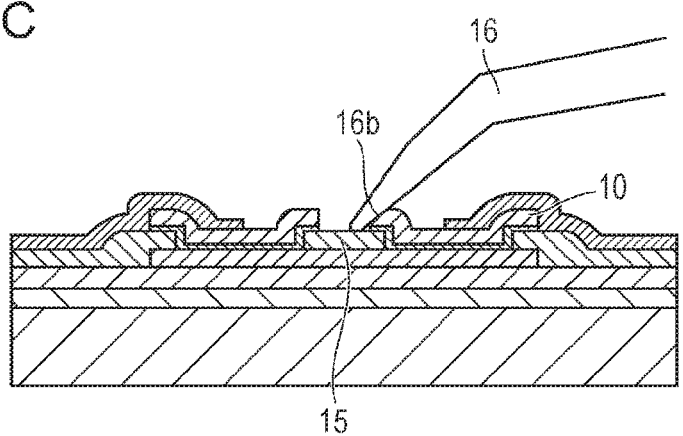

As the contact probe 16 is bent, a side surface 16b of the contact probe 16 comes into contact with the second wiring layer 10, as shown in FIG. 2C. When the contact area between the side surface 16b and the second wiring layer 10 reaches a certain value or larger, an electrical inspection is performed. The contact area between the side surface 16b and the second wiring layer 10 is preferably 50 $\mu m^2$ or larger. In this state, a natural oxidized film on the surface of the second wiring layer 10 has been sufficiently scraped off. In the present invention, the electrical inspection is performed in this manner so that the occurrence of electrical inspection marks can be reduced in the wiring layers.

The contact probe 16 is normally composed of, for example, tungsten or rhenium tungsten. The Vickers hardness of tungsten is 3400 MPa, and the Vickers hardness of rhenium is 2450 MPa. In order to reduce deformation of the contact-probe receiving section 15, it is desirable that the Vickers hardness of the contact-probe receiving section 15 be designed in view of these points. For example, even if a contact probe composed of tungsten is brought into contact with tantalum having a Vickers hardness of about 870 MPa with a force applied in an electrical inspection, there will be no deformation found in the tantalum. On the other hand, although the Vickers hardness of aluminum normally used as a wiring layer is 500 MPa, if a contact probe is similarly brought into contact with aluminum, the aluminum may deform. In view of these points, the Vickers hardness of the contact-probe receiving section 15 is preferably 870 MPa or higher. The receiving section 15 is located where it is exposed to liquid, such as ink. In view of these points, it is desirable that the contact-probe receiving section 15 be composed of, for example, silicon oxide, silicon carbide, silicon nitride, aluminum nitride, aluminum oxide, or zirconia.

Figure 2D:
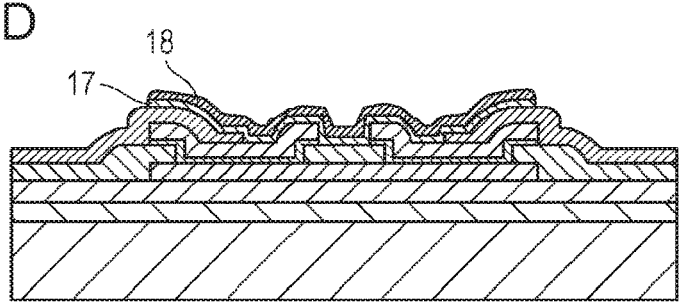

After the electrical inspection, a barrier metal layer 17 and a bump section 18 are formed, as shown in FIG. 2D. The barrier metal layer 17 is formed by depositing titanium tungsten to a predetermined thickness over the entire surface of the substrate by using, for example, a vacuum deposition device. The bump section 18 is composed of, for example, gold. For example, the bump section 18 is patterned by photolithography by using a resinous resist. Accordingly, a pad is formed. After forming the pad, the pad undergoes, for example, a heating process at 300° C. for at least one hour. Even in this case, the occurrence of alloying between the bump section 18 and the wiring layers 9 and 10 can still be reduced. An example of the heating process performed at 300° C. for at least one hour includes a process performed before a mounting process for connecting to an external wire.

Subsequently, for example, a member having a flow channel and discharge ports for liquid is formed, whereby a liquid-discharge-head substrate is obtained.

Figure 3A:
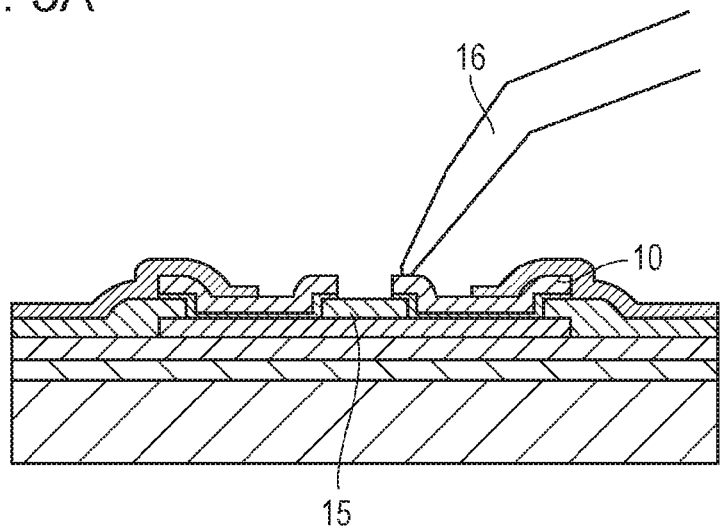
FIGS. 3A and 3B illustrate a method for manufacturing the liquid-discharge-head substrate.
Figure 3B:
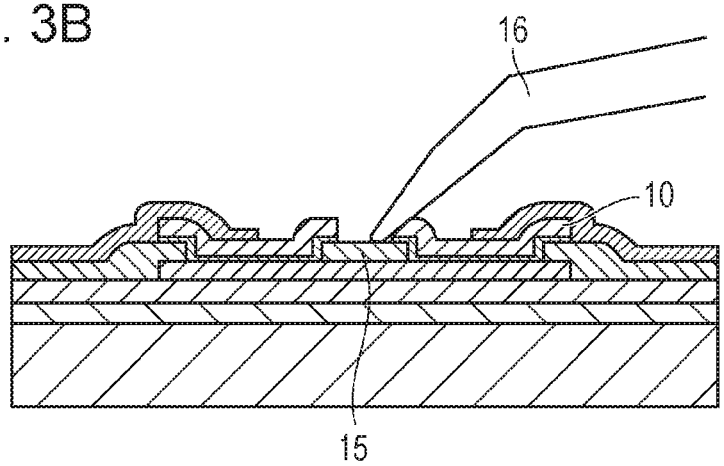

The method of electrical inspection described above with reference to FIGS. 2A to 2D involve bringing the contact probe 16 into contact with the contact-probe receiving section 15 and then bringing the contact probe 16 into contact with the second wiring layer 10. As an alternative method, the contact probe 16 may be brought into contact with the second wiring layer 10 first, and may be subsequently brought into contact with the contact-probe receiving section 15. This method will be described with reference to FIGS. 3A and 3B. First, as shown in FIG. 3A, the contact probe 16 is brought into contact with the second wiring layer 10. From this state, the contact probe 16 and the second wiring layer 10 are brought into contact with each other with greater force, so that the contact probe 16 pierces the second wiring layer 10. As a result, the contact probe 16 comes into contact with the contact-probe receiving section 15, as shown in FIG. 3B. According to this method, even though the contact probe 16 scrapes off a portion of the second wiring layer 10, an electrical inspection mark remaining in the second wiring layer 10 does not form an overhanging shape. In other words, the occurrence of problematic electrical inspection marks can be reduced.

In order to reduce the amount of second wiring layer 10 to be scraped off, it is desirable that the sidewall of the second wiring layer 10, which is the portion to be scraped off, be sloped relative to the surface of the substrate 1. In other words, the surface of the second wiring layer 10 with which the contact probe 16 is to come into contact is desirably sloped relative to the surface of the substrate 1. For example, the slope angle is set between 30° and 60° relative to the surface of the substrate 1. is more desirable that the slope angle be set between 40° and 50°.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-021652 filed Feb. 5, 2015, which is hereby incorporated by reference herein in its entirety.

What is claimed is:

1. A method for manufacturing a liquid-discharge-head substrate having a substrate, an energy-generating element, and a pad, the energy-generating element and the pad being provided on the substrate, the pad being electrically connected to the energy-generating element, the liquid-discharge-head substrate causing liquid to be discharged by causing the energy-generating element to supply energy to the liquid, the method comprising:

providing the substrate having the energy-generating element and the pad, the pad having a heating resistor layer, a first wiring layer, a second wiring layer, and a contact-probe receiving section, the contact-probe receiving section having a Vickers hardness that is higher than a Vickers hardness of the second wiring layer;

performing an electrical inspection by bringing a contact probe into contact with the second wiring layer in the pad;

bringing the contact probe into contact with the contact-probe receiving section after the electrical inspection; and forming, after performing the electrical inspection, a barrier metal layer and bump section, wherein the barrier metal layer is formed by depositing titanium tungsten to a predetermined thickness over a part of a surface of the substrate.

2. The method for manufacturing the liquid-discharge-head substrate according to claim 1, wherein the Vickers hardness of the contact-probe receiving section is 870 MPa or higher.

3. The method for manufacturing the liquid-discharge-head substrate according to claim 1, wherein the contact-probe receiving section is composed of at least one of silicon oxide, silicon carbide, silicon nitride, aluminum nitride, aluminum oxide, and zirconia.

4. The method for manufacturing the liquid-discharge-head substrate according to claim 1, wherein the contact probe is composed of tungsten or rhenium tungsten.

5. The method for manufacturing the liquid-discharge-head substrate according to claim 1, wherein a surface of the second wiring layer with which the contact probe comes into contact is sloped relative to a surface of the substrate.

6. The method for manufacturing the liquid-discharge-head substrate according to claim 5, wherein an angle of the surface of the second wiring layer is between 30° and 60° relative to the surface of the substrate.

7. The method for manufacturing the liquid-discharge-head substrate according to claim 1, wherein the first wiring layer is composed of an aluminum-silicon alloy.

8. The method for manufacturing the liquid-discharge-head substrate according to claim 1, wherein the second wiring layer is composed of an aluminum-copper alloy.

9. The method for manufacturing the liquid-discharge-head substrate according to claim 1, wherein the heating resistor layer is sandwiched between the first wiring layer and the second wiring layer.

10. The method for manufacturing the liquid-discharge-head substrate according to claim 1, wherein the contact-probe receiving section is provided in a region where the second wiring layer and the heating resistor layer form a gap in the pad.

* * * * *